United States Patent [19]

Möhlmann et al.

[11] Patent Number: 5,335,018
[45] Date of Patent: Aug. 2, 1994

[54] DIGITAL PHASE-LOCKED LOOP

[75] Inventors: Ulrich Möhlmann, Buchholz-Dibbersen; Gerd Onken, Hamburg; Dieter Kunze, Lentförden; Jörg Wolber, Pinneberg-Thesdorf, all of Fed. Rep. of Germany

[73] Assignee: U.S. Philips Corporation, New York, N.Y.

[21] Appl. No.: 142,645

[22] Filed: Oct. 25, 1993

Related U.S. Application Data

[63] Continuation of Ser. No. 969,613, Oct. 30, 1992, abandoned.

[30] Foreign Application Priority Data

Nov. 25, 1991 [DE] Fed. Rep. of Germany ....... 4138543

[51] Int. Cl.$^5$ .............................................. H04N 5/12
[52] U.S. Cl. ..................................... 348/536; 348/540
[58] Field of Search .................. 375/119, 120; 328/72, 328/134, 155, 55; 307/516; 331/1 A, 20; 358/148, 158, 159; H04N 5/04, 5/12, 5/05

[56] References Cited

U.S. PATENT DOCUMENTS

| | | |
|---|---|---|
| 3,621,125 | 11/1971 | Parker . |
| 3,983,498 | 9/1976 | Malek ................................ 328/155 |
| 4,308,619 | 12/1981 | Hughes ............................... 375/119 |
| 4,309,662 | 1/1982 | Baudoux ......................... 331/1 A X |
| 4,400,817 | 8/1983 | Sumner .............................. 375/119 |
| 4,611,229 | 9/1986 | Stivastava et al. ................. 358/148 |
| 4,691,327 | 9/1987 | Wenger ......................... 331/1 A X |

*Primary Examiner*—James J. Groody
*Assistant Examiner*—David E. Harvey
*Attorney, Agent, or Firm*—Bernard Franzblau

[57] ABSTRACT

A digital phase-locked loop (PLL) which responds to a square-wave input signal of on expected frequency $f_E$ and comprises a change-over switch which is switched in response to square-wave signals or different frequencies and precedes a main divider operating with a divisor D and which produces the output signal of the phase-locked loop. The change-over switch is activated as a function of the output signal and the input signal. In order to provide symmetrical locking in of the phase-locked loop and a small capture-and-hold range, the change-over switch is switched between a first square-wave signal of the frequency $f_1$, a second square-wave signal of the second frequency $f_2$ and a third square-wave signal of the frequency $f_3$, in which:

$$f_1 \cdot 1/D = f_E$$

and $$k \cdot f_1 = f_2 + (k-1) \cdot f_3,$$

A switching logic is provided which controls the change-over switch in such that it is switched to the signal of the first frequency $f_1$ in the period between two pulses of the output signal, and to the signal of the second frequency $f_2$ during a pulse of the output signal and a first state of the input signal, and to the signal of the third frequency $f_3$ during a pulse of the output signal and a second state of the input signal. And $f_2 > f_3$ when the circuit locks in on the leading edges of the pulses of the input signal and $f_2 < f_3$ when the circuit locks in on the trailing edges.

24 Claims, 3 Drawing Sheets

DIGITAL PHASE-LOCKED LOOP

This is a continuation of application Ser. No. 07/969,613, filed Oct. 30, 1992 now abandoned.

BACKGROUND OF THE INVENTION

This invention relates to a digital phase-locked loop (PLL) which responds to a square-wave input signal having an expected frequency $f_E$ and comprises a change-over switch which is switched in response to square-wave signals of different frequencies and precedes a main divider operating with a divisor D which produces the output signal of the phase-locked loop, the change-over switch being activated in dependence upon said output signal and the input signal.

A known phase-locked loop of this type, which is built in the IC MN6163 by the Firm Matsushita, comprises a change-over switch which switches between two input frequencies, one of which is derived by dividing down the other. An exclusive-OR comparison, in dependence upon how the change-over switch is switched between the two input frequencies, is performed between the signal to which the PLL should respond and the output signal of the circuit. During the periods when the two signals simultaneously have a low level or simultaneously have a high level, there is a switch to the first frequency and during the other periods there is a switch to the second frequency. This circuit has the particular drawback that the leading edges of the pulses of the output signal of the circuit are not adjusted symmetrically with respect to the pulses of the input signal. Moreover, the phase relation between these two signals is subjected to a phase jitter. The phase relation also depends on the pulse width of the signals, because the two signals are constantly compared, in response to which the change-over switch is activated. Since a phase comparison is performed all the time, the circuit has a relatively large capture-and-hold range, which is undesirable for many purposes.

SUMMARY OF THE INVENTION

It is an object of the invention to provide a digital phase-locked loop of the type described in the opening paragraph having a small capture-and-hold range.

According to the invention this object is achieved in that the change-over switch is switched between a first square-wave signal of the frequency $f_1$, a second square-wave signal of a second frequency $f_2$ and a third square-wave signal of a frequency $f_3$, in which:

$$f_1 \cdot 1/D = f_E,$$

and $$k \cdot f_1 = f_2 + (k-1) \cdot f_3,$$

a switching logic is provided which controls the change-over switch in such a way that it is switched to the signal of the first frequency $f_1$ in the period between two pulses of the input signal, and to the signal of the second frequency $f_2$ during a pulse of the input signal and a first state of the output signal, and to the signal of the third frequency $f_3$ during a pulse of the input signal and a second state of the output signal, and in that $f_2 > f_1 > f_3$ when the circuit locks in on the leading edges of the pulses of the input signal and $f_2 < f_1 < f_3$ when the circuit locks in on the trailing edges.

Three square-wave signals having three different frequencies are applied to the change-over switch of the digital phase-locked loop, while the above-mentioned relations between these frequencies should be satisfied. Both the pulses of the input signal and those of the output signal represent a digital signal which, basically, can assume only two amplitude values. Moreover, it does not matter whether the input signal and/or the output signal in the quiescent state has a high level and the pulses have a low level, or whether the reverse applies. For the purpose of explanation it will hereinafter be assumed that the two signals have a low level in their quiescent state and the pulses are at a high level.

In any case, if the circuit is to lock in on the leading edges of the pulses, the second square-wave signal of the frequency $f_2$ should have a higher frequency than the third square-wave signal of the frequency $f_3$. If, conversely, the circuit is to lock in on the trailing edges of the input signal, the reverse applies.

A switching logic for switching the change-over switch between the three square-wave signals is provided and its output signal is applied to the main divider.

During the period in which the input signal has a low level, the change-over switch is switched to the signal of the first frequency $f_1$ by the switching logic. During the period when the pulses of the input signal of the circuit have a high level, the amplitude of the output signal of the circuit is also a factor. If this amplitude has a low level, the change-over switch is switched to the second square-wave signal of the second frequency. However, if the amplitude of the output signal has a high level, the change-over switch is switched to the third square-wave signal of the third frequency. Due to the above-mentioned mutual relations of the frequencies and the division ratios of the main divider, the output signal of the circuit arrangement and the leading edges of the pulses in this signal occur in time at a predeterminable instant during the pulses of the input signal of the circuit.

The lock-in range of the pulses of the input signal of the circuit can be determined by means of the choice of the frequencies $f_1$, $f_2$ and $f_3$ and by means of the mutual frequency ratios. This locking instant can be set via the factor k in the equation $k \cdot f_1 = f_2 + (k-1) \cdot f_3$, where k is a natural number in the numerical range between 1 and infinity. If the choice is $k=1$, the circuit locks in on the leading edge of the pulses of the input signal; at k tending toward infinity the circuit will lock in on the trailing edge of these pulses. If the circuit is to lock in on the centre of the pulses of the input signal, the choice in accordance with a further embodiment of the invention should be $k=2$, in which $2f_1 = f_2 + f_3$.

The frequencies of the signals and the pulses occurring in these signals may thus be chosen in such a way that the output signal of the main divider changes from low to high level exactly in the middle of a pulse of the input signal. If the circuit has not yet locked in correctly and if the leading edge of the pulses of the output signal of the circuit appears with respect to time after the middle of the pulses of the input signal, the period during which the change-over switch is switched to the second square-wave signal of the second frequency $f_2$ is longer. This signal has a relatively higher frequency and thus generates more pulses which are applied to the divider D. Consequently, the next output pulse of the divider D appears at a relatively earlier instant so that the next leading edges of the output pulses appear at an earlier instant with respect to time and are set at the middle of the pulses of the input signal. Conversely, if the circuit has not locked in and if the leading edges of the pulses of the output signal appear with respect to time before the middle of the pulses of the input signal, the period in which pulses of the second square-wave signal are applied to the main divider is relatively shorter and the period in which pulses of the third square-wave signal $f_3$ of the lower frequency are applied to the main divider is relatively longer. As a result, the leading edges of the output signal of the divider appear at a relatively later instant at the next pulse of the input signal because relatively fewer pulses were applied to the divider during the previous pulse. In this way the edge moves slightly backwards again at the next pulse because the divider D supplies an output signal somewhat later. Here again the circuit locks in on the middle of the pulses of the input signal. This applies in a corresponding manner to $k \neq 2$, i.e. for locking in at a point which is not located in the middle of the pulses of the input signal.

Due to the fact that the circuit locks in symmetrically, a small capture-and-hold range can also be achieved, while both ranges are equally large.

As compared with the circuit known in the state of the art, the digital phase-locked loop according to the invention has the additional advantage that the frequency condition, i.e. the desired frequency of the output signal of the circuit and the phase condition, i.e. the phase position of the input and output signals with respect to each other are independently adjustable in the desired manner by means of the choice of the different frequencies. The frequency condition is adjustable by means of the choice of the frequency $f_1$ divided by the divisor D results in the output frequency of the circuit or that it corresponds to the expected frequency of the input signal on which the circuit is to lock in. The frequencies $f_2$ and $f_3$ of the second and the third square-wave signal determine the phase condition, i.e. the relative position of the pulses of the output signal with respect to the pulses of the input signal of the circuit.

For a possibly simple structure of the circuit it is advantageous to generate the first, second and third square-wave signals from one signal. In accordance with one embodiment of the invention dividers are therefore provided, by means of which the three square-wave signals of the frequencies $f_1$, $f_2$ and $f_3$ are derived by dividing a generator square-wave signal of a frequency $f_0$.

Based on the above-described free choice of the frequency condition on the one hand and the phase condition on the other hand, it is possible, in accordance with a further embodiment, to cause the dividers to operate with integral divisors. This simplifies the structure of the circuit and saves complicated dividers which do not operate with integral divisors.

In a further embodiment of the invention the frequency $f_2$ is chosen to be twice as large as the frequency $f_1$ and the third square-wave signal has a frequency $f_3$ of 0, i.e. a constant amplitude. At this choice of the frequencies the above-mentioned conditions for the three frequencies are met and this provides the advantage that only one square-wave signal and one divider are required for generating the three signals. In a further embodiment the circuit may then have such a structure that a square-wave signal generator is provided which supplies a signal of the second frequency $f_2$ which is applied to a divider operating with the divisor 2, whose output signal represents the square-wave signal of the first frequency $f_1$.

In accordance with a further embodiment, the phase-locked loop is arranged in a television receiver for detecting the horizontal sync pulses of a possibly received television signal in an output signal of a tuner of the television receiver. The above-described symmetrical lock-in of the circuit and the resultant small capture-and-hold range is particularly suitable for use in the detection of the horizontal sync pulses of a television signal, because this small capture-and-hold range is unlikely to lead to interferences. It can be detected by means of the phase-locked loop whether the television receiver or the tuner of the television receiver or does not receive a television signal. Based on this recognition, further circuits in the television receiver can be adjusted accordingly. Particularly for detecting the horizontal sync pulses in a television signal it is advantageous that the square-wave signal generator operates at a frequency $f_0$ of 843.75 kHz and that the main divider performs a division by D=27. As a result, the output signal of the circuit is then a frequency which substantially exactly corresponds to the frequency of the horizontal sync signal in a television signal.

If the horizontal sync pulses of a television signal are to be detected in a television receiver in the manner described, it is advantageous not to apply these pulses directly to the circuit because they are generally superimposed with interference and thus do not always ensure a flawless operation of the circuit. To eliminate interference, it is therefore advantageous if, in a further embodiment, the output signal of the tuner is applied to an amplitude separator by means of which the sync pulses are separated and applied to a subsequently arranged low-pass filter operating as an integrator whose output signal is compared in a comparator with a switching threshold. A monostable multivibrator whose output signal represents the input signal of the phase-locked loop, is triggered when the switching threshold is exceeded. By the choice of the time constant of the integrator and the switching threshold of the comparator, the sensitivity, or insensitivity of the circuit, as well as the time delay with which the monostable MV supplies an output signal can be influenced when horizontal sync pulses are separated by the amplitude separator. Furthermore, the choice of these two parameters influences the number of interference pulses which reach the input of the phase-locked loop. The output signal of the monostable MV is now a digital signal which can assume only two states and which can be further processed by the phase-locked loop.

When used in a television receiver, the phase-locked loop precedes an evaluation circuit which includes a D flip-flop whose D input receives the input signal of the phase-locked loop, whose clock input receives the output signal of the phase-locked loop and whose output signal controls two current mirrors whose output currents are applied to a capacitor connected to a reference potential, one current mirror circuit charging the capacitor and the other discharging the capacitor, while the voltage across the capacitor is applied to a comparator whose output signal indicates whether the phase-locked loop has locked in or not locked in on a television signal comprising horizontal sync pulses.

The charge condition of the capacitor will determine whether or not the circuit has locked in. The voltage across the capacitor can be evaluated by means of a comparator with a hysteresis which eliminates switching uncertainties and supplies an output signal which can easily be further processed and indicates the locking condition of the circuit. The weighting is adjustable by means of the value of the charge and discharge currents of the two current mirrors. A charge-discharge current ratio of 4:1 to 7:1 is advantageous for use in a television receiver. If the current ratio is higher, noise will be recognized as a signal, and if it is lower, a noisy signal will no longer be recognized as such.

In accordance with a further embodiment of the invention, the television receiver includes a horizontal phase-locked loop which receives the horizontal synchronizing signal in a received television signal, said loop comprising a phase comparator and a controllable oscillator, the input of the controllable oscillator being connectable to the output of the phase comparator or to an output of a DC source via a controllable switch, said DC source supplying a voltage causing the oscillator to oscillate at a predeterminable nominal horizontal frequency. The controllable switch is controlled in dependence upon the output signal of the comparator in such a way that the controllable oscillator supplies a signal at the nominal horizontal frequency when the phase-locked loop has not locked in.

The television receiver includes a horizontal phase-locked loop which locks in on the horizontal sync pulses and whose output signal for further processing in the television receiver, particularly for the deflection circuit, is further processed for display on a display screen. In this case, the digital phase-locked loop according to the invention is used to recognize whether a television signal is received or not received. If no television signal is received, a problem in the circuits known in the state of the art is that the horizontal phase-locked loop supplies an arbitrary frequency because it can no longer adjust to any input frequency. However, this in turn implies that the representation on the display screen is no longer possible due to a fluctuating horizontal frequency. Particularly, On-Screen-Displays can no longer be realised. The digital phase-locked loop according to the invention can be used in the manner described above for the purpose of detecting whether a television signal is received or not received. This information, which can be particularly derived from the output signal of the above-described evaluation circuit, can be used for the purpose of switching the oscillator of the horizontal phase-locked loop to its rated frequency during those periods in which the comparator of the evaluation circuit indicates that no television signal is received. When no television signal is received, a representation on the display screen is then still possible. For example, a display on the display screen may also be realised during a search tuning process. This display may be given, for example, by way of fading in given adjusting values of the television receiver.

BRIEF DESCRIPTION OF THE DRAWINGS

These and other aspects of the invention will be apparent from and elucidated with reference to the embodiments described hereinafter. In the drawings.

DESCRIPTION OF THE PREFERRED EMBODIMENTS

Figure 1:
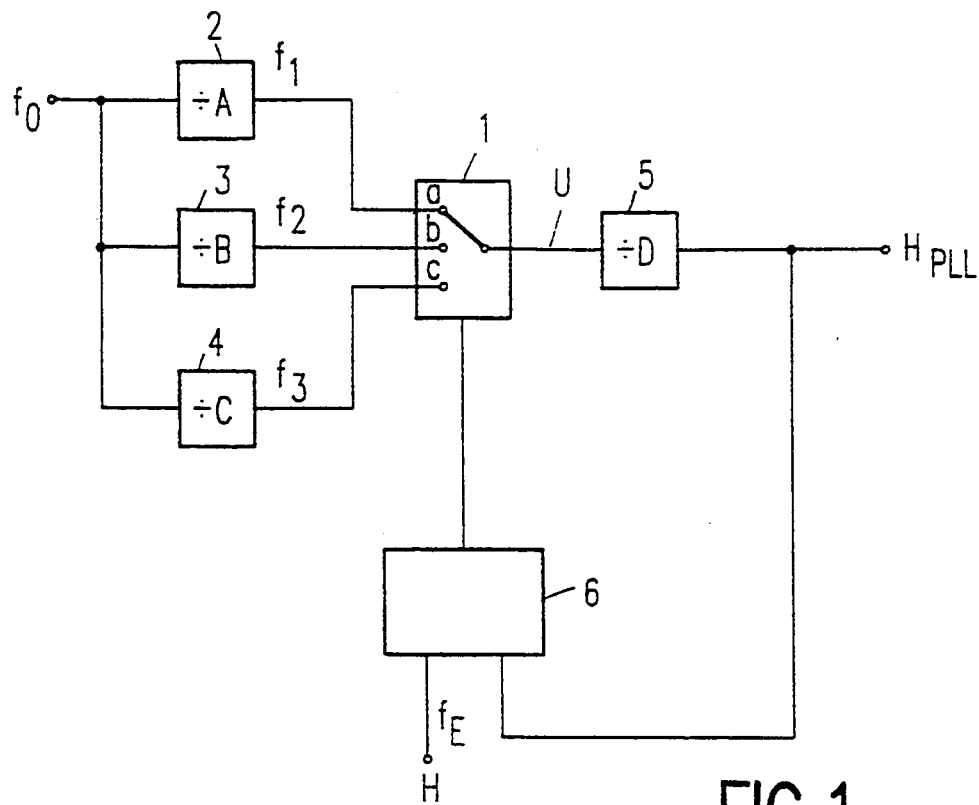
FIG. 1 shows a first embodiment of the digital phase-locked loop.

A first embodiment of the digital phase-locked loop according to the invention, shown in FIG. 1, includes a change-over switch 1 having three inputs. Switching positions a, b and c are provided for switching to the three inputs. In the phase-locked loop shown in FIG. 1 the three square-wave signals applied to these inputs of the change-over switch 1 are derived from a square-wave signal of the frequency $f_0$ which in turn may originate from a generator not shown in the Figure. The square-wave signal of the frequency $f_0$ is divided by a divisor A in a first divider 2 so that the output of the divider 2 supplies a square-wave signal of the frequency $f_1$ which is applied to the switching contact a of the change-over switch 1.

In a second divider 3 the signal of the frequency $f_0$ is divided by a divisor B so that the output of the divider 3 supplies a second square-wave signal of the frequency $f_2$ which is applied to the switching contact b of the change-over switch 1.

For generating the third square-wave signal of the frequency $f_3$, the signal of the frequency $f_0$ is divided in a third divider 4 by a divisor C. The third square-wave signal is applied to the switching contact c of the change-over switch 1.

The change-over switch 1, whose output supplies a signal U, precedes a main divider 5 operating with a divisor D. The output signal of the main divider 5 also represents the output signal of the phase-locked loop which is denoted by $H_{PLL}$ in the Figure.

A switching logic 6 is also provided, whose input receives the output signal of the phase-locked loop $H_{PLL}$ and the input signal to which the phase-locked loop is to respond. This input signal is denoted by H in the Figure and has an expected frequency of $f_E$. The switching logic 6 controls the change-over switch 1 in dependence upon these signals. The switching logic 6 may of course be integrated in the change-over switch 1.

The relations of the frequencies $f_1$, $f_2$, $f_3$ could be chosen so that $f_2 > f_1 > f_3$, wherefore the divisors A, B and C are $C > A > B$, and the frequency $f_1$ as well as of the divisor D, are chosen so that the condition $f_1/D = f_E$ should be satisfied. The frequency $f_1$ of the first square-wave signal, divided down by means of the divisor D, should thus exactly correspond to the expected $f_E$ of the input signal at which the circuit is to lock in. The lock-in instant can be set via a factor k in the equation, $k\,f_1 = f_2 + (k-1)\,f_3$. For a symmetrical lock-in, k should be 2. Thus, it follows that when $k=2$, the sum of the frequencies $f_2$ and $f_3$ should correspond to double the value of the frequency of the signal $f_1$. This is necessary to ensure a symmetrical lock-in of the circuit.

For a possibly simple structure of the circuit the dividers 2, 3, 4 and 5 should operate with integral divisors. While taking the above-mentioned relations of the frequencies and of the dividers into account, the dividers 2, 3 and 4 may operate, for example with the following divisors:

TABLE

| A | B | C |
|---|---|---|
| 2 | 1 | 00 |
| 4 | 3 | 6 |
| 6 | 4 | 12 |
| 8 | 5 | 20 |
| 10 | 6 | 30 |
| 12 | 7 | 40 |

The first row of this Table shows a layout in which the divisor C tends towards infinity. Mathematically, this only means that the third square-wave signal of the frequency $f_3$ has a frequency of 0. Thus, the signal always has a constant level. The divisors in accordance with the first row also show that the divisor B is 1 so that the divider 3 may be completely dispensed with and the signal $f_0$ may simultaneously be the signal $f_2$.

Figure 2:
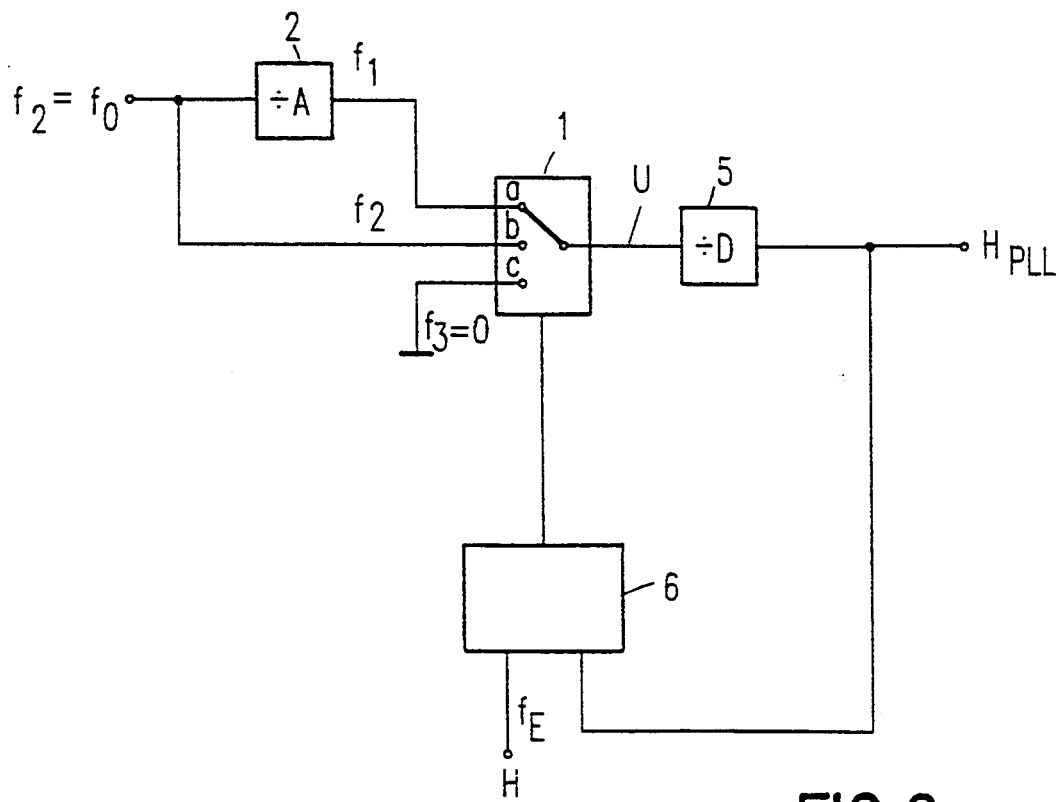
FIG. 2 shows a second embodiment of the digital phase-locked loop.

FIG. 2 shows a second embodiment of the digital phase-locked loop in which the divisors in accordance with the first row of the Table are used.

The second divider 3 in the circuit of FIG. 1 may be dispensed with, because the divisor B=1. The signal of the frequency $f_0$ may thus be directly used as the second square-wave signal of the frequency $f_2$. The frequency of the third signal $f_3$ is 0 so that the contact c of the change-over switch 1 can receive a signal of constant amplitude. In FIG. 2, this contact is connected to ground.

The circuit of FIG. 2 does not have any functional drawbacks as compared with the circuit of FIG. 1, but there is an economy of two dividers.

The operation of the circuits of FIG. 1 and FIG. 2 will hereinafter be described in greater detail with reference to a pulse diagram shown in FIG. 3 in which some signals are represented with respect to time.

Figure 3:
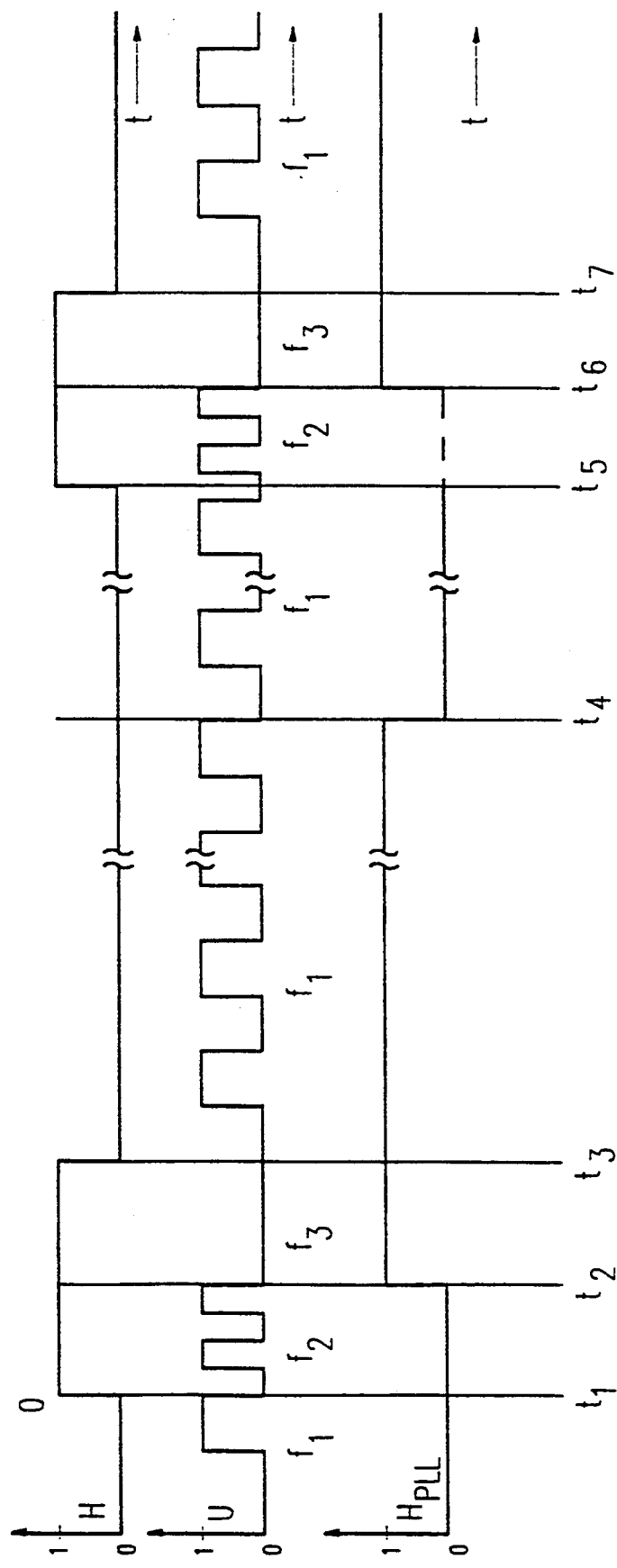
FIG. 3 shows a pulse diagram of the phase-locked loop of FIG. 2.

A first characteristic curve shown in FIG. 3 represents the input signal H. This input signal may have two levels, viz. a low level denoted by 0 in FIG. 3 and a high level denoted by 1 in the Figure. In its quiescent state the signal has a low level. When pulses occur in the signal, the signal has a high level. This signal H may be a horizontal synchronizing signal of a television signal or a signal derived from this signal.

A second characteristic curve shown in FIG. 3 represents the output signal U of the change-over switch 1 of the circuit of FIG. 2.

A third characteristic curve shown in FIG. 3 represents the output signal $H_{PLL}$ of the circuit and the output signal of the divider 5 of the circuit of FIG. 2.

The switching logic 6 of the phase-locked loop of FIG. 2 controls the change-over switch 1 in dependence upon the output signal $H_{PLL}$ and the input signal H. FIG. 3 shows that the change-over switch is switched to its position a, i.e. to the signal of the frequency $f_1$ during those periods in which the input signal H has a low level. During these periods the level of the output signal $H_{PLL}$ of the circuit does not play any role for determining the position of the change-over switch 1.

During those periods in which the input signal H has a high level, thus in the periods in which a pulse occurs in this signal, the instantaneous level of the output signal $H_{PLL}$ is also taken into account. If this signal has a low level during a pulse in the signal H, the change-over switch is switched to its position b, i.e. to the signal of the frequency $f_2$. However, if the signal $H_{PLL}$ has a high level during a pulse in the signal H, the change-over switch 1 is switched to its position c, i.e. to the signal of the frequency $f_3$.

The operation of the circuit will hereinafter be described in greater detail with reference to FIG. 3. FIG. 3 shows the locked-in state of the circuit, i.e. the state in which the leading edges of the output signal $H_{PLL}$ are exactly synchronized at the middle of the pulses of the signal H.

In this synchronized, or adjusted state of the circuit, no pulses are applied to the divider 5 of FIG. 2 in accordance with the representation in FIG. 3 during the interval between the instant $t_2$, i.e. the instant at which the signal changes from low to high level at the output of the divider 5, and the instant $t_3$ at which the trailing edge of the pulse of the input signal appears. As from $t_3$ the pulses divided down by means of the divider 2 reach the input of the divider 5. At the instant $t_4$ the input signal applied to the divider 5 and divided down by the divisor D again generates a pulse at the output of the divider 5. During the subsequent interval between $t_4$ and $t_5$, i.e. up till the leading edge of the next pulse of the input signal H, the change-over switch 6 receives the signal $f_1$ divided down by means of the divider 2 and subsequently up till the instant $t_6$, at which the output signal of the divider 5 changes to high level again, it receives the signal $f_2 = f_0$ which is not divided down. The counter has thus counted once, for example, in the interval between $t_2$ and $t_6$. During the interval between $t_2$ and $t_3$ the divider 5 received the signal of the frequency $f_3$, which in the embodiment of FIG. 2 has a frequency $f_3$ of 0, and thus has a constant level. During the interval between $t_3$ and $t_5$ the divider 5 received the first signal of the frequency $f_1$. During the interval between $t_5$ and $t_6$ the divider received the signal of the relatively higher frequency $f_2$. The values of the frequencies $f_1$, $f_2$ and $f_3$ and of the divisor D of the divider 5 of FIG. 2 are chosen such that the divider comprises such a number of pulses in the interval between $t_2$ and $t_6$ that an output signal changes from low to high level at the instants $t_2$ and $t_6$, i.e. in the middle, with respect to time, of the pulses of the signal H. This procedure is continued between two pulses of the signal H in the synchronized state of the circuit.

In the non-synchronized state of the circuit the change at the instant $t_2$ from low level to high level in the signal $H_{PLL}$ is not realised in the middle, with respect to time, of the pulses of the signal H. However, from the instant $t_2$ to the instant $t_3$, in which the pulse of the signal is ended, the divider 5 does not receive a pulse. Between the instants $t_3$ and $t_5$ the divider receives the same number of pulses of the signal of the frequency $f_1$ as in the synchronized state. During the interval between $t_5$ and $t_6$ the divider receives, however, a number of pulses deviating from the synchronized state. The number of pulses depends on the position of the edges. The output signal of the divider 5 will change from low to high level again at the instant $t_6$, which instant was chosen in accordance with the frequency ratios of $f_1$ and of the pulses applied to the divider 5 in the same way as in the synchronized state, and this in a manner such that the instant $t_6$ occurs at the middle with respect to time of a pulse of the signal H. The output signal of the divider 5 and the overall circuit are thus again synchronized up to the middle with respect to time of the pulses of the signal H. This up-synchronization process may cover several periods.

The circuit responds slowly, also when in the non-synchronized state of the circuit the change-over from low to high level of the signal $H_{PLL}$ is effected at an instant at which no pulse is present in the signal H. This is caused by the fact that at the instant $t_3$, independent of the state of the signal $H_{PLL}$, the signal $f_1$ is applied to the input of the divider 5 of FIG. 2 in this case. The division process carried out by the divider 5 is then continued in the manner described above, so that at the instant $t_6$, at which the adjusting process may cover several periods of the signal $H_{PLL}$, a change of the signal from low to high level is realised at its output in so far as the signal H has a high level at this instant.

As explained, the frequency $f_3$ was chosen to be 0 in FIG. 3. This involves a relatively simple layout of the circuit, corresponding to FIG. 1. The pulse diagram in FIG. 3 may basically be used for a circuit as shown in FIG. 1, in which the frequency $f_3$ is not 0, but should have a smaller value than the signal of the frequency $f_2$ for locking in on the leading edges of the pulses of the signal H. In this case pulses would also be counted during the intervals between $t_2$ and $t_3$ and between $t_6$ and $t_7$, but during these intervals it would be a smaller number of pulses than would reach the divider 5 during the other intervals. The choice of the frequencies $f_1$, $f_2$, $f_3$ and of the divisor D of the divider 5 of the circuit of FIG. 1 should be such in this case that the output signal of the divider 5 changes from low to high level exactly at the instants $t_2$ and $t_6$ in the synchronized state of the circuit. The phase position of H and $H_{PLL}$ in the adjusted state thus depends on the choice of the frequencies $f_1$, $f_2$, $f_3$ and the divisor D. If they are chosen in such a way that $t_2$ and $t_6$ are in the sync pulse middle, the control range will be symmetrical with respect to the quiescent position. Also in this layout of a circuit in accordance with, for example FIG. 1, synchronizing up to the pulses of the signal H is realised in the non-synchronized state of the circuit. For example, if the change-over at the instant $t_2$ from low to high level in the signal $H_{PLL}$ occurs, with respect to time, before the middle of the pulse of the signal H, the interval between $t_2$ and $t_3$ will be longer and the interval between $t_5$ and $t_6$ will be shorter. However, since a significantly smaller number of pulses reach the divider 5 (FIG. 2) with respect to time during the interval between $t_2$ and $t_3$ (signals of a relatively low frequency) as compared with the interval between $t_5$ and $t_6$ (a signal of a relatively high frequency), the interval between $t_2$ and $t_6$ lasts longer than in the synchronized state because the counter takes a longer time to run through the counting process once. The edge at the instant $t_6$ is thus moved backwards with respect to time so that the circuit slowly synchronizes upwards. The same applies conversely to an edge of the signal $H_{PLL}$ moved backwards with respect to time and with respect to the pulse H.

In both circuit modifications an equal number of pulses is always counted in response to switching the signal of the frequency $f_1$ to the divider 5, which is performed independently of the state of the signal $H_{PLL}$ during the interval between $t_3$ and $t_5$, so that during this interval there is no readjustment. A readjustment is only carried out during the intervals between $t_1$ and $t_3$ and $t_5$ and $t_7$.

Figure 4:
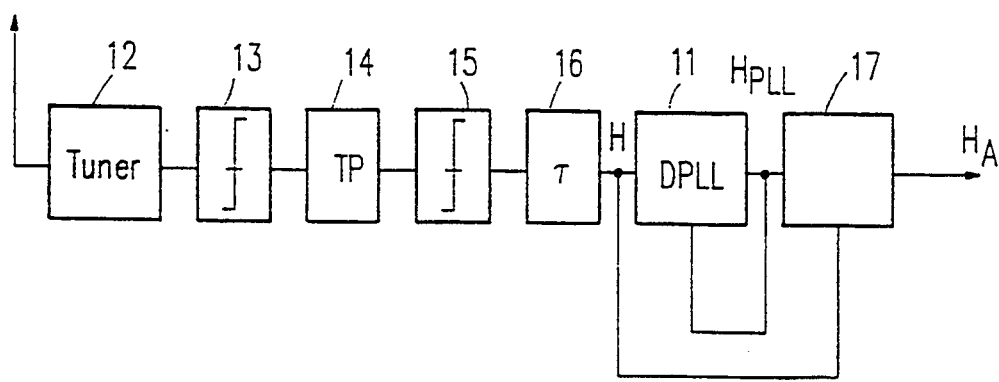
FIG. 4 shows the digital phase-locked loop preceded by an amplitude separator, integrator, comparator and monostable MV and succeeded by an evaluation unit.

FIG. 4 shows a block diagram of some circuit elements of a television receiver not further shown in the Figure. The above-described digital phase-locked loop is indicated as block 11 in this Figure. The signal H applied to the input of the block 11, i.e. the phase-locked loop, is derived from a horizontal synchronizing signal of a television signal. To this end a tuner 12 is provided which precedes an amplitude separator 13 separating horizontal sync pulses in the television signal. A low-pass filter arranged subsequent to the amplitude separator 13 operates as an integrator. Its output signal is applied to a further amplitude separator or a comparator which supplies an output signal when the signal supplied by the low-pass filter 14 exceeds a given value. A monostable MV 16 is then triggered and supplies a pulse. The output signal of the monostable MV 16 represents the signal H which is applied to the digital phase-locked loop 11, i.e. the phase-locked loop as shown in FIG. 1 or in FIG. 2.

The phase-locked loop 11 precedes an evaluation unit 17 which receives both the output signal $H_{PLL}$ of the phase-locked loop and the output signal H of the monostable MV 16. The evaluation unit 17 supplies an output signal $H_A$ which indicates whether or not the digital phase-locked loop 11 has locked in.

The upstream arrangement of the circuit elements 13 to 16 has the advantage that possible disturbances which may be superimposed on the television signal supplied by the tuner 12 and hence on the horizontal sync pulses in this television signal can be substantially filtered. For example, in the case of superimposed noise, the monostable MV 16 supplies unambiguous pulses which are superimposed by a considerably smaller number of interference pulses.

Figure 5:
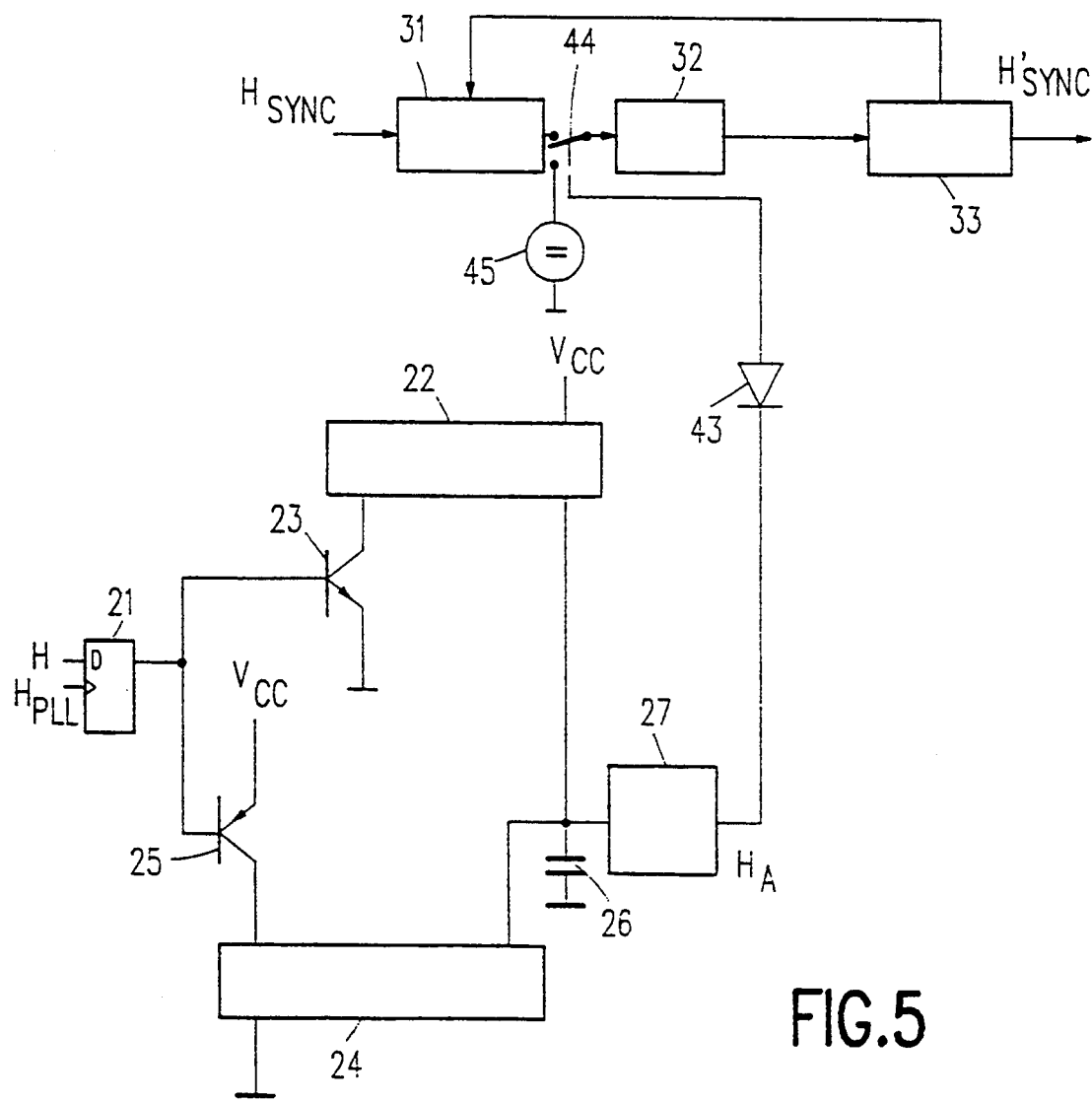
FIG. 5 shows the evaluation unit of FIG. 4 and a block diagram of a horizontal phase-locked loop in a television receiver.

FIG. 5 shows the evaluation unit 17 of FIG. 4 in greater detail. FIG. 5 further shows a horizontal phase-locked loop as may be arranged in a television receiver, which is not further shown.

At its input end the evaluation unit has a D flip-flop 21 whose clock input receives the output signal of the digital phase-locked loop. The input signal of the phase-locked loop is applied to the D input of the flip-flop 21. At the positive edge of the signal $H_{PLL}$, i.e. of the output signal, the flip-flop 21 thus always takes over the instantaneous value of the input signal of the phase-locked loop. If the phase-locked loop has locked in, this input signal is always at a high level at these instants. If the phase-locked loop has not locked in, the signal has a low level at these instants. The output signal of the D flip-flop 21 thus has a high level in the locked state of the circuit and a low level in the unlocked state. This signal is applied to a first current mirror circuit 22 having a transistor 23 and to a second current mirror circuit 24 having a transistor 25. During those periods in which the output signal of the D flip-flop 21 has a high level, the transistor 23 is turned on and the first current mirror circuit 22 supplies a current with which a grounded capacitor 26 is charged.

During those periods in which the output signal of the D flip-flop 21 has a low level, the transistor 25 is turned on and the second current mirror circuit 24 discharges the capacitor 26. The voltage appearing across the capacitor 26 is evaluated by means of a comparator 27 with hysteresis, which supplies a high level signal when the voltage exceeds a given value and a low level when the voltage falls below this value.

The weighting is adjustable by means of the values of the charge and discharge currents, i.e. the currents of the two current mirror circuits 22 and 24, respectively. A charge-discharge current ratio of 4:1 to 7:1 was found experimentally. If the current ratio is higher, noise is also recognized as a signal, and if it is lower a noisy signal is no longer certainly recognized as a signal.

The output signal $H_A$ of the comparator 27 thus indicates in an integrated form with respect to time whether the phase-locked loop 11 of FIG. 4 has locked in or not locked in.

This information can now be used in a television receiver for controlling a horizontal phase-locked loop in this receiver accordingly. This horizontal phase-locked loop, whose output signal is used, for example, for controlling the horizontal deflection of a display tube for displaying the picture, has the property that it supplies a substantially arbitrary output signal in the absence of an input signal. This in turn has the result that the display of the picture on the display screen is no longer possible.

The output signal $H_A$ of the comparator 27 is used for the purpose of switching the oscillator of the horizontal phase-locked loop to its nominal value and thus allow display of a picture on a display screen, even when no signal is received.

FIG. 5 shows the horizontal phase-locked loop in the form of a phase comparator 31, a filter 32 arranged downstream of this comparator and a controllable oscillator 33. This phase-locked loop should lock in on the horizontal sync pulses in a television signal in known manner. To this end the oscillator 33 is controlled at its input end in such a way that its output supplies a signal of the desired frequency. This signal is denoted by $H'_{SYNC}$ in FIG. 5.

If no television signal is received, this control signal for the oscillator 33 may assume substantially arbitrary and particularly also fluctuating values so that the signal $H'_{SYNC}$ also assumes fluctuating values and display of the picture on the display screen is no longer possible.

Exactly in this case, in which no television signal is received, the digital phase-locked loop according to the invention has, however, not locked in and the comparator 27 supplies an output signal $H_A$ which has a low level. This signal $H_A$ is now used for the purpose of switching a diode 43 connected at its cathode end to the output of the comparator 27. At its anode end the diode 43 is connected to a switch 44 which it controls. By means of the switch 44 the output of the phase comparator 33 or an output of a DC source 45 can be alternatively connected to the input of the filter 32.

If a received television signal or the horizontal sync pulses in this television signal are recognized by the phase-locked loop according to the invention, the output signal of the comparator 27 has a high level. The diode 43 is then conducting and the switch 44 is connected to the output of the phase comparator 31 of $H_{PLL}$. The horizontal phase-locked loop, which is constituted by the elements 31, 32 and 33, then operates in a normal manner, i.e. it is adjusted to the horizontal sync pulses in the television signal.

If, on the other hand, the phase-locked loop according to the invention does not recognize a television signal, the output signal $H_A$ has a low level so that the diode 43 is blocked. The switch 44 is then connected to the output of the DC source 45. The direct voltage supplied by this source is received at the input of the controllable oscillator 33. The direct voltage supplied by the source 45 is chosen in such a way that the controllable oscillator 33 supplies a signal having a nominal horizontal frequency, i.e. the normal frequency of a horizontal sync signal in a television signal. In this way the control of the deflection circuit of the television receiver etc. will be possible, so that displays of the picture on the display screen are possible, even through no television signal is received, which displays may be, for example On-Screen-Displays, i.e. displays requiring given adjusting parameters of the television receiver.

What is claimed is:

1. A digital phase-locked loop (PLL) which responds to a square-wave input signal of expected frequency $f_E$ and comprises: a change-over switch which is switched in response to square-wave signals of different frequencies and precedes a main divider operating with a divisor D, the main divider producing the output signal of the phase-locked loop, the change-over switch being activated via a switching logic dependent upon said output signal and the input signal, characterized in that the change-over switch is switched between a first square-wave signal of a first frequency $f_1$, a second square-wave signal of a second frequency $f_2$ and a third square-wave signal of a third frequency $f_3$, in which $f_1 (1/D) = F_E$, and the switching logic controls the change-over switch such that it is switched to the first signal of the first frequency $f_1$ in the period between two pulses of the input signal, and to the second signal of the second frequency $f_2$ during a pulse of the input signal and a first state of the output signal, and to the third signal of the third frequency $f_3$ during a pulse of the input signal and a second state of the output signal, and in that $f_2 > f_1 > f_3$ when the circuit locks in on the leading edges of the pulses of the input signal and $f_2 < f_1 < f_3$ when the circuit locks in on the trailing edges.

2. A phase-locked loop as claimed in claim 1, wherein $2 \cdot f_1 = f_2 + f_3$.

3. A phase-locked loop as claimed in claim 1, further comprising dividers for deriving the three square-wave signals of the frequencies $f_1$, $f_2$ and $f_3$ by dividing a square-wave signal of a frequency $f_O$.

4. A phase-locked loop as claimed in claim 3, wherein the dividers operate with integral divisors.

5. A phase-locked loop as claimed in claim 2, wherein $f_2 = 2f_1$ and $f_3 = 0$.

6. A phase-locked loop as claimed in claim 5, wherein a square-wave signal generator is provided which supplies a signal of the second frequency $f_2$ which is applied to a divider operating with the divisor 2 and whose output signal represents the square-wave signal of the first frequency $f_1$.

7. A phase-locked loop as claimed in claim 6 wherein the phase-locked loop is arranged in a television receiver for detecting the horizontal sync pulses of a received television signal in an output signal of a tuner of the television receiver.

8. A phase-locked loop as claimed in claim 7 wherein the square-wave signal generator operates at a frequency $f_0$ of 843.75 kHz and in that the main divider performs a division by $D = 27$.

9. A television receiver including a phase-locked loop as claimed in claim 7 wherein the output signal of the tuner is applied to an amplitude separator by means of which the sync pulses are separated and applied to a low-pass filter operating as an integrator whose output signal is compared in a comparator with a switching threshold, a monostable multivibrator, whose output signal represents the input signal of the phase-locked loop, being triggered when the switching threshold is exceeded.

10. A television receiver as claimed in claim 9 wherein the phase-locked loop precedes an evaluation circuit which includes a D flip-flop whose D input receives the input signal of the phase-locked loop and whose clock input receives the output signal of the phase-locked loop and whose output signal controls two current mirrors whose output currents are applied to a capacitor connected to a reference potential, one current mirror circuit charging the capacitor and the other discharging the capacitor, and in that the voltage across the capacitor is applied to a comparator whose output signal indicates whether the phase-locked loop has locked in or not locked in on a television signal comprising horizontal sync pulses.

11. A television receiver as claimed in claim 10, further comprising a horizontal phase-locked loop which receives the horizontal synchronizing signal in a received television signal, said loop comprising a phase comparator and a controllable oscillator, with an input of the controllable oscillator is connectable to an output of the phase comparator or to an output of a DC source via a controllable switch, said DC source supplying a voltage causing the oscillator to oscillate at a predetermined nominal horizontal frequency, and in that the controllable switch is controlled in dependence upon the output signal ($H_A$) of the comparator in such a way that the controllable oscillator supplies a signal at the nominal horizontal frequency when the phase-locked loop has not locked in.

12. A phase-locked loop as claimed in claim 2 further comprising: dividers for deriving the three square-wave signals of the frequencies $f_1$, $f_2$ and $f_3$ by dividing a square-wave signal of a frequency $f_0$.

13. A phase-locked loop as claimed in claim 1 wherein the phase-locked loop is arranged in a television receiver for detecting the horizontal sync pulses of a received television signal in an output signal of a tuner of the television receiver.

14. A television receiver including a phase-locked loop as claimed in claim 13 wherein the output signal of the tuner is applied to an amplitude separator by means of which the sync pulses are separated and applied to a subsequently arranged low-pass filter operating as an integrator whose output signal is compared in a comparator with a switching threshold, a monostable multivibrator, whose output signal represents the input signal of the phase-locked loop, being triggered when the switching threshold is exceeded.

15. A television receiver as claimed in claim 14, wherein the phase-locked loop precedes an evaluation circuit which includes a D flip-flop whose D input receives the input signal of the phase-locked loop, whose clock input receives the output signal of the phase-locked loop and whose output signal controls two current mirrors whose output currents are applied to a capacitor connected to a reference potential, one current mirror circuit charging the capacitor and the other discharging the capacitor, and in that the voltage across the capacitor is applied to a comparator whose output signal indicates whether or not the phase-locked loop has locked in on a television signal comprising horizontal sync pulses.

16. A television receiver as claimed in claim 15 further comprising: a horizontal phase-locked loop which receives the horizontal synchronizing signal in a received television signal, said loop comprising a phase comparator and a controllable oscillator with an input of the controllable oscillator connectable to an output of the phase comparator or to an output of a DC source via a controllable switch, said DC source supplying a voltage causing the oscillator to oscillate at a predetermined nominal horizontal frequency, and in that the controllable switch is controlled in dependence upon the output signal ($H_A$) of the comparator in such a way that the controllable oscillator supplies a signal at the nominal horizontal frequency when the phase-locked loop has not locked in.

17. A television receiver including a phase-locked loop as claimed in claim 1, wherein the phase-locked loop precedes an evaluation circuit which includes a D flip-flop whose D input receives the input signal of the phase-locked loop, whose clock input receives the output signal of the phase-locked loop and whose output signal controls two current mirrors whose output currents are applied to a capacitor connected to a reference potential, one current mirror circuit charging the capacitor and the other discharging the capacitor, and in that the voltage across the capacitor is applied to a comparator whose output signal indicates whether or not the phase-locked loop has locked in on a television signal comprising horizontal sync pulses.

18. A television receiver as claimed in claim 17 further comprising: a horizontal phase-locked loop which receives the horizontal synchronizing signal in a received television signal, said loop comprising a phase comparator and a controllable oscillator with an input of the controllable oscillator connectable to an output of the phase comparator or to an output of a DC source via a controllable switch, said DC source supplying a voltage causing the oscillator to oscillate at a predetermined nominal horizontal frequency, and in that the controllable switch is controlled in dependence upon the output signal ($H_A$) of the comparator in such a way that the controllable oscillator supplies a signal at the nominal horizontal frequency when the phase-locked loop has not locked in.

19. A digital phase-locked loop comprising:
means for generating first, second and third square wave signals of different frequencies $f_1$, $f_2$, and $f_3$, respectively,
switching means having input means for receiving said square-wave signals and an output,
a main frequency divider coupled between the output of the switching means and an output terminal of the phase-locked loop, and
switch control means having input means coupled to said output of the main frequency divider and to an input terminal which receives a square-wave input signal of a frequency $f_B$, said switch control means being responsive to a square-wave output signal of the main frequency divider and to said square-wave input signal to supply a control signal to a control input of the switching means so that the switching means selectively passes said first, second and third square-wave signals to said main frequency divider as a function of said input signal and said output signal, said switch control means controlling the switching means so that the switching means passes the first square-wave signal of the frequency $f_1$ in the period between two pulses of the output signal, the second square-wave signal of the frequency $f_2$ being passed when the input and output square-wave signals are in opposite states and the third square-wave signal of the frequency $f_3$ being passed when the input and output square-wave signals are in the same state, and wherein $$f_1 (1/D) = f_E$$

and $$k f_1 = f_2 + (k-1) f_3$$

where D is the frequency divisor of the main frequency divider and k is a whole number between 1 and infinity.

20. A digital phase-locked loop as claimed in claim 19 wherein k=2 so that $2 f_1 = f_2 + f_3$.

21. A digital phase-locked loop as claimed in claim 20 wherein $f_3 = 0$ and $f_2 = 2 f_1$.

22. A digital phase-locked loop as claimed in claim 19 wherein the frequency condition of the phase-locked loop is adjustable as a function of the frequency $f_1$ and of the frequency divisor D and the phase condition of the phase-locked loop is determined by the frequencies $f_2$ and $f_3$ of the respective second and third square-wave signals.

23. A digital phase-locked loop as claimed in claim 19 wherein said square-wave signal generating means comprises:

first, second and third frequency dividers coupled between a terminal supplying a square-wave signal of a frequency $f_0$ and the input means of the switching means, wherein the first, second and third frequency dividers have integral divisors.

24. A digital phase-locked loop as claimed in claim 21 wherein said square-wave signal generating means comprises:

a further frequency divider coupled between a further terminal supplying a square-wave signal of a frequency $f_2$ and a first terminal of the input means of the switching means, means further coupling said further terminal to a second terminal of said input means of the switching means, and means for coupling a third terminal of said input means of the switching means to a point of constant reference voltage.

* * * * *